US012596326B2

(12) United States Patent　　(10) Patent No.:　US 12,596,326 B2

Kim et al.　　(45) Date of Patent:　Apr. 7, 2026

(54) HOLOGRAPHIC OPTICAL DEVICE AND MANUFACTURING METHOD THEREFOR

(71) Applicant: LG Chem, Ltd., Seoul (KR)

(72) Inventors: Sung Yeon Kim, Daejeon (KR); Min Soo Song, Daejeon (KR); So Young Choo, Daejeon (KR); Hye Won Hwang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 711 days.

(21) Appl. No.: 17/607,223

(22) PCT Filed: Sep. 24, 2020

(86) PCT No.: PCT/KR2020/012990

§ 371 (c)(1),
(2) Date: Oct. 28, 2021

(87) PCT Pub. No.: WO2021/066391

PCT Pub. Date: Apr. 8, 2021

(65) Prior Publication Data

US 2022/0221821 A1　Jul. 14, 2022

(30) Foreign Application Priority Data

Sep. 30, 2019　(KR) ........................ 10-2019-0121206

(51) Int. Cl.
　*G03H 1/04*　　(2006.01)
　*G03F 7/00*　　(2006.01)
　*G03H 1/02*　　(2006.01)
(52) U.S. Cl.
　CPC ........... *G03H 1/0402* (2013.01); *G03F 7/001* (2013.01); *G03H 1/024* (2013.01);
　　(Continued)

(58) Field of Classification Search
None
See application file for complete search history.

(56) References Cited

U.S. PATENT DOCUMENTS

| | | |
|---|---|---|
| 4,475,792 A | 10/1984 | Sica, Jr. |
| 5,279,689 A | 1/1994 | Shvartsman |

(Continued)

FOREIGN PATENT DOCUMENTS

| | | |
|---|---|---|
| CN | 1033422 A | 6/1989 |
| CN | 102902002 A | 1/2013 |

(Continued)

OTHER PUBLICATIONS

C. Yang, Deposition of ultrathin films by a withdrawal method, 1980, Xerox Research Centre of Canada, vol. 74, p. 117-119. (Year: 1980).*

(Continued)

*Primary Examiner* — William R Alexander
*Assistant Examiner* — Mackenzi Waddell
(74) *Attorney, Agent, or Firm* — Lerner David LLP

(57)　　ABSTRACT

An embodiment of the present disclosure provides a holographic optical element and a manufacturing method of a holographic optical element including holographic gratings, the manufacturing method including: a step (a) of forming a photosensitive substrate by coating one surface of a substrate with a photosensitive resin; and a step (b) of recording the holographic gratings by irradiating each of one surface and the other surface of the photosensitive substrate with laser light, wherein in the step (a), the photosensitive resin is applied so that a height of a photosensitive resin coating layer varies along a predetermined direction.

2 Claims, 7 Drawing Sheets

(52) U.S. Cl.
CPC . *G03H 2001/0439* (2013.01); *G03H 2240/26* (2013.01); *G03H 2260/34* (2013.01)

(56) References Cited

U.S. PATENT DOCUMENTS

| | | | |
|---|---|---|---|
| 5,784,507 A | 7/1998 | Holm-Kennedy et al. | |
| 8,519,325 B1 | 8/2013 | Lu et al. | |
| 2009/0051894 A1 | 2/2009 | Shibazaki et al. | |
| 2011/0014380 A1 | 1/2011 | Fudoji et al. | |
| 2012/0188791 A1 | 7/2012 | Voloschenko et al. | |
| 2014/0092384 A1 | 4/2014 | Ebata et al. | |
| 2014/0140654 A1 | 5/2014 | Brown et al. | |
| 2014/0230381 A1 | 8/2014 | Tornblom | |
| 2015/0062715 A1 | 3/2015 | Yamada et al. | |
| 2015/0168651 A1 | 6/2015 | Nishiwaki | |
| 2016/0033784 A1 | 2/2016 | Levola et al. | |
| 2016/0154532 A1 | 6/2016 | Campbell | |
| 2018/0031749 A1 | 2/2018 | Kallos et al. | |
| 2018/0129060 A1 | 5/2018 | Lee et al. | |
| 2018/0129165 A1 | 5/2018 | Lee et al. | |
| 2019/0212588 A1 | 7/2019 | Waldern et al. | |
| 2020/0220625 A1 | 7/2020 | Tanaka et al. | |
| 2020/0365379 A1 | 11/2020 | Her et al. | |
| 2020/0408969 A1 | 12/2020 | Yoon et al. | |
| 2021/0223585 A1* | 7/2021 | Waldern | B29D 11/00682 |
| 2021/0341877 A1* | 11/2021 | Funayama | G03H 1/0272 |
| 2022/0260763 A1* | 8/2022 | Norris | G02B 5/1852 |

FOREIGN PATENT DOCUMENTS

| | | | |
|---|---|---|---|
| JP | H10253955 A | 9/1998 | |
| JP | 2000510603 A | 8/2000 | |
| JP | 2005010231 A | 1/2005 | |
| JP | 2005052741 A | 3/2005 | |
| JP | 2006292818 A | 10/2006 | |
| JP | 2007057622 A | 3/2007 | |
| JP | 201549278 A | 3/2015 | |
| JP | 2016530617 A | 9/2016 | |
| JP | 2017076516 A | 4/2017 | |
| JP | 2019-053289 A | 4/2019 | |
| KR | 20100088458 A | 8/2010 | |
| KR | 20140090640 A | 7/2014 | |
| KR | 20160028561 A | 3/2016 | |
| KR | 20170037980 A | 4/2017 | |
| KR | 20180051187 A | 5/2018 | |
| KR | 20180051802 A | 5/2018 | |
| TW | 200921289 A | 5/2009 | |
| TW | I525354 B | 3/2016 | |
| WO | 9732243 A1 | 9/1997 | |
| WO | 2009119677 A1 | 10/2009 | |
| WO | 2012157697 A1 | 11/2012 | |
| WO | 2014199572 A1 | 12/2014 | |
| WO | 2018152336 A1 | 8/2018 | |
| WO | 2019012764 A1 | 1/2019 | |
| WO | 2019083247 A1 | 5/2019 | |
| WO | 2019132345 A1 | 7/2019 | |

OTHER PUBLICATIONS

Taiwanese Search Report for Application No. 109133560 dated Jan. 11, 2024, 2 pages.

International Search Report for PCT/KR2020/012990 dated Jan. 6, 2021, 2 pgs.

Davis, Raleigh L. et al: "Creating Controlled Thickness Gradients in Polymer Thin Films via Flowcoating", LANGMUIR, vol. 30, No. 19, May 9, 2014 (May 9, 2014), pp. 5637-5644.

Extended European Search Report for Application No. 20870914.7 dated May 27, 2022. 7 pgs.

\* cited by examiner

[FIG. 1]
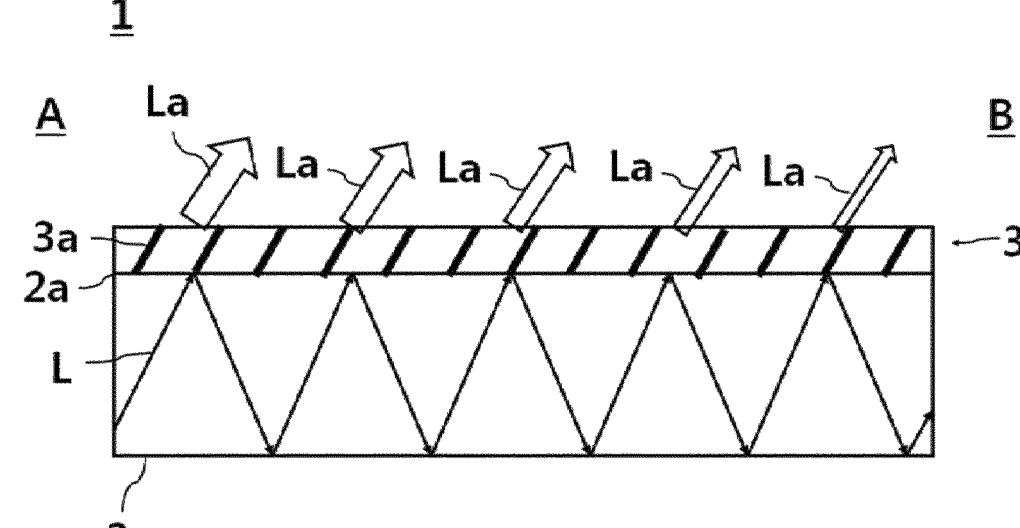
[FIG. 2]
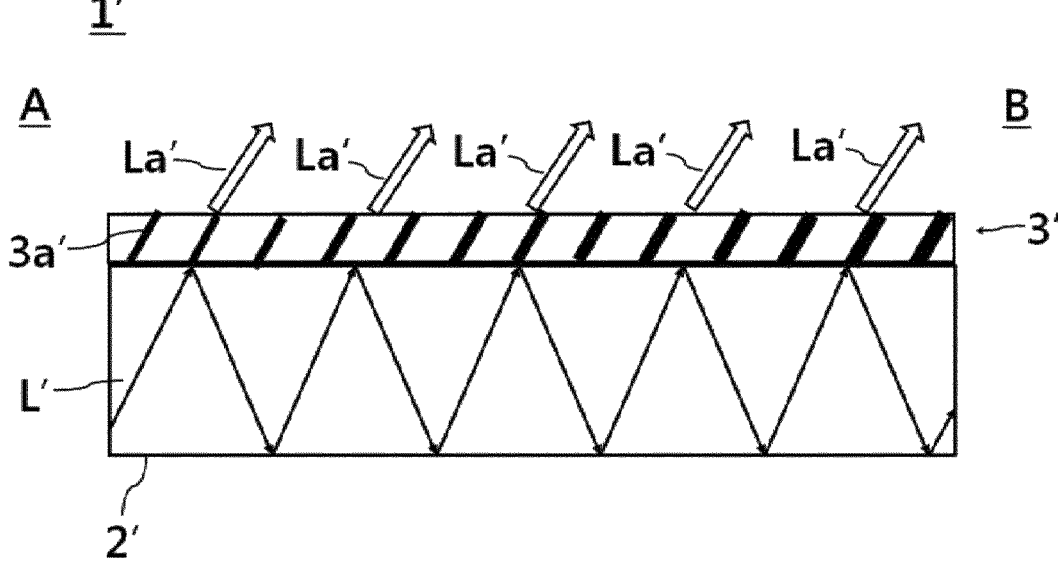

[FIG. 3]
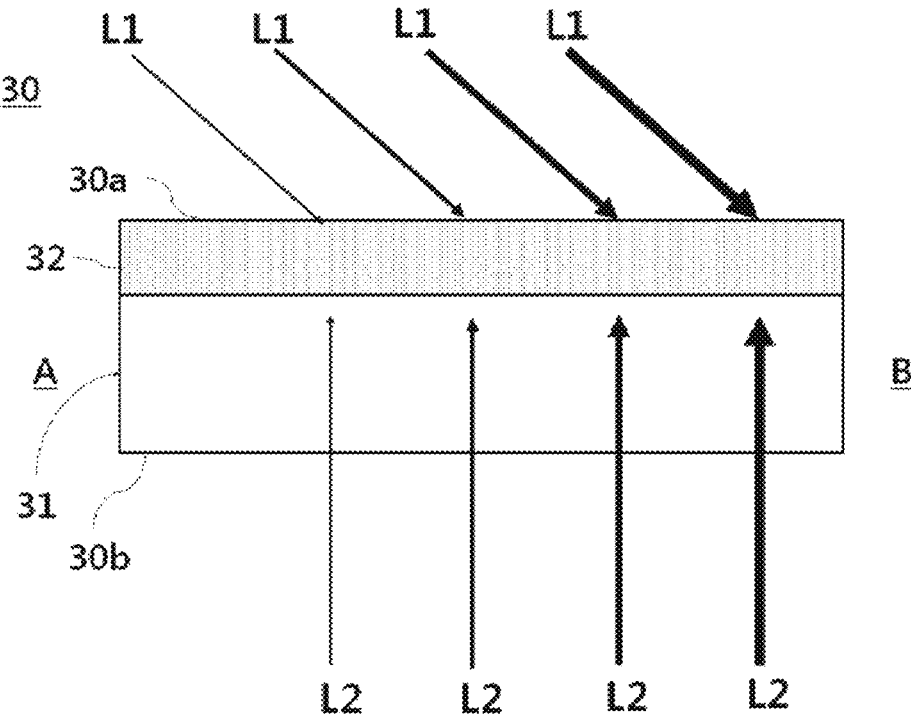
[FIG. 4]
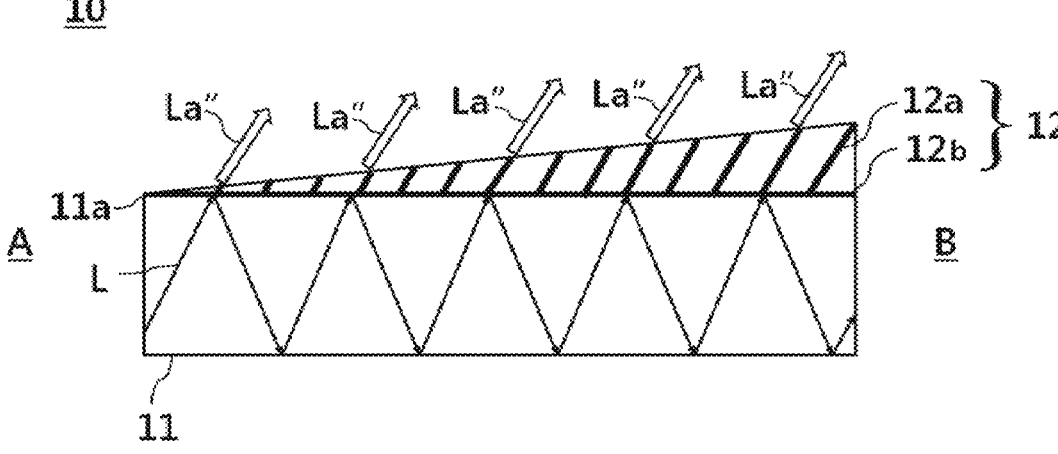

[FIG. 5]
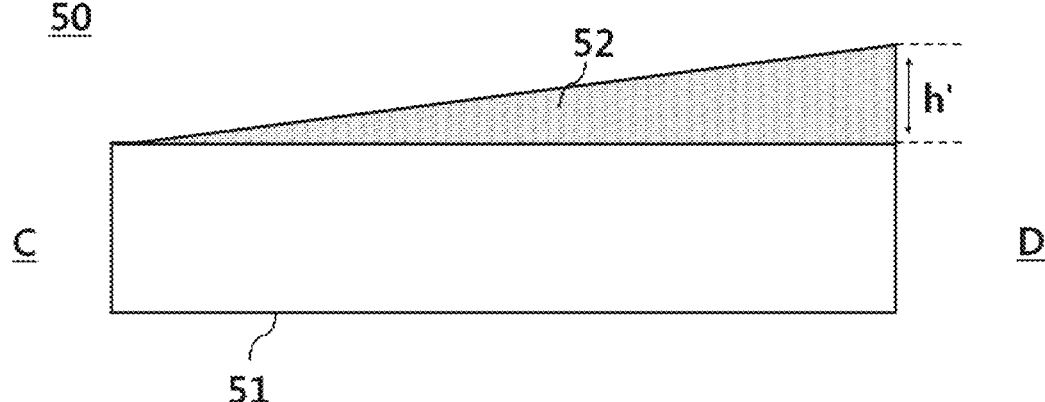
[FIG. 6]
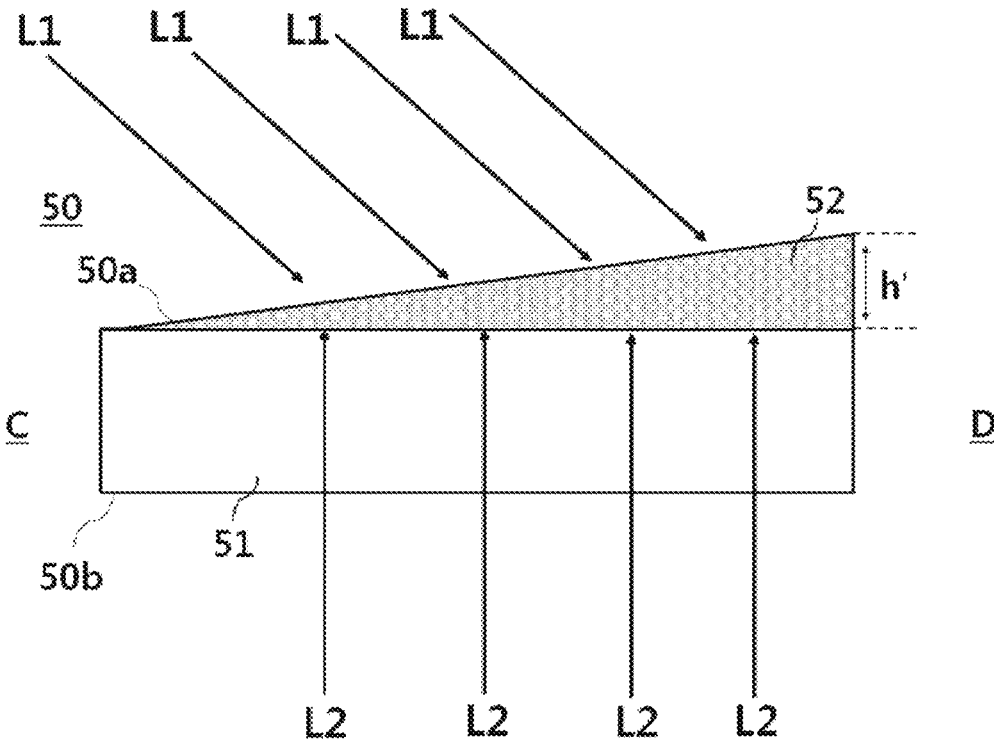

[FIG. 7]
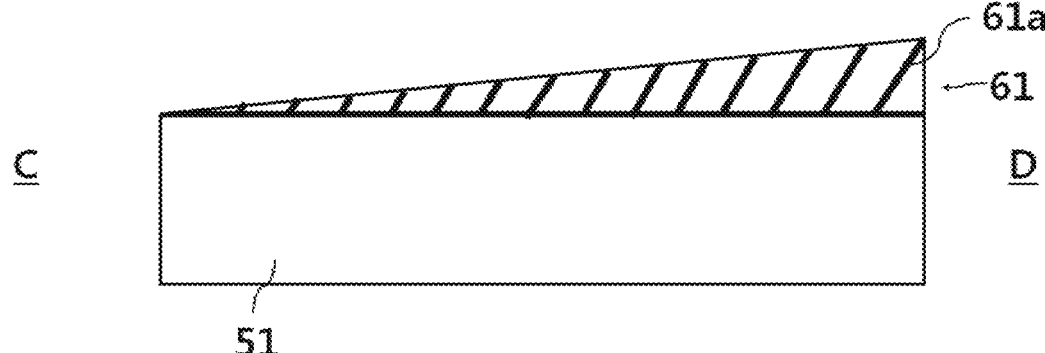
[FIG. 8]
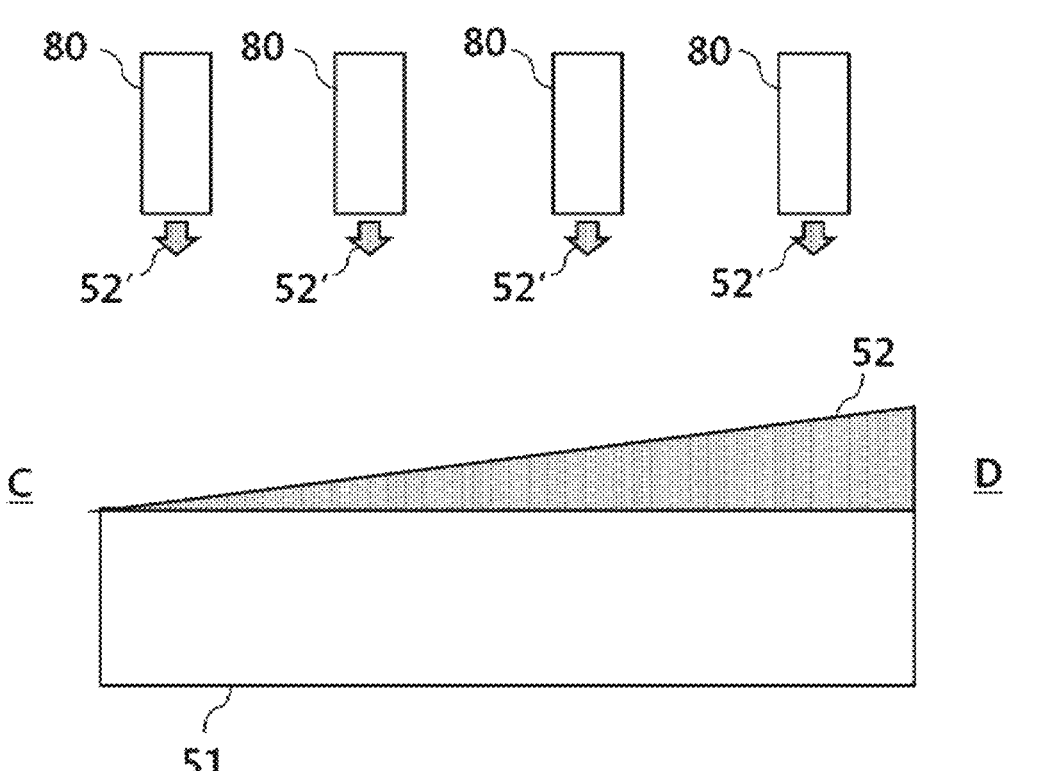

[FIG. 9]
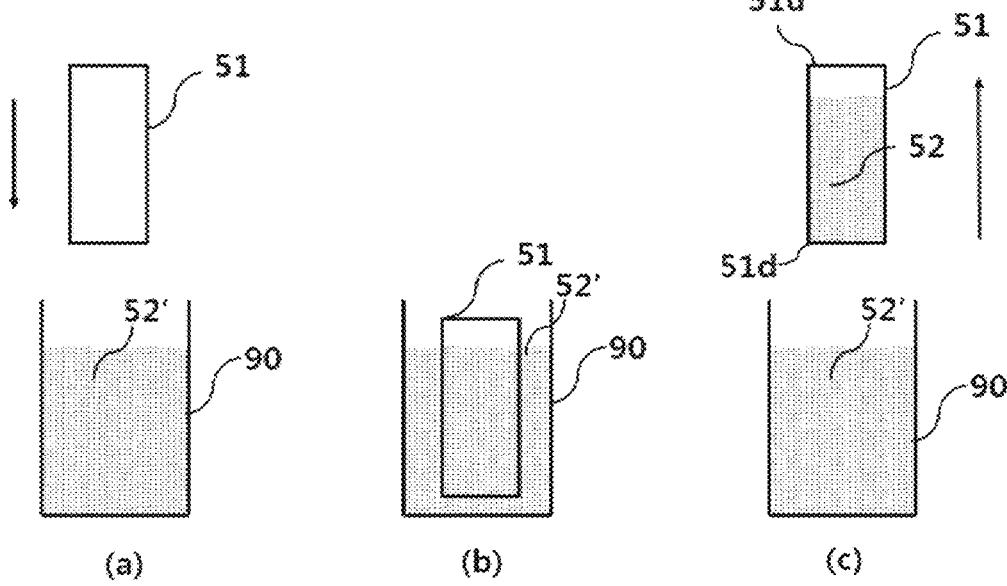
(a)                    (b)                    (c)
[FIG. 10]
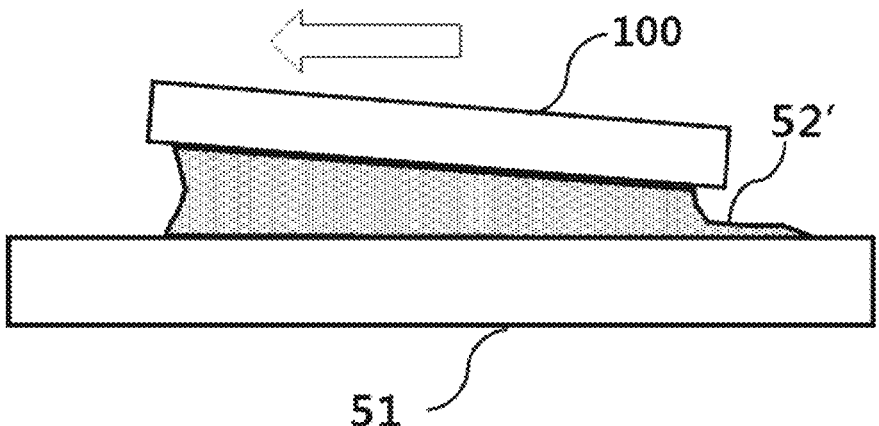

[FIG. 11]
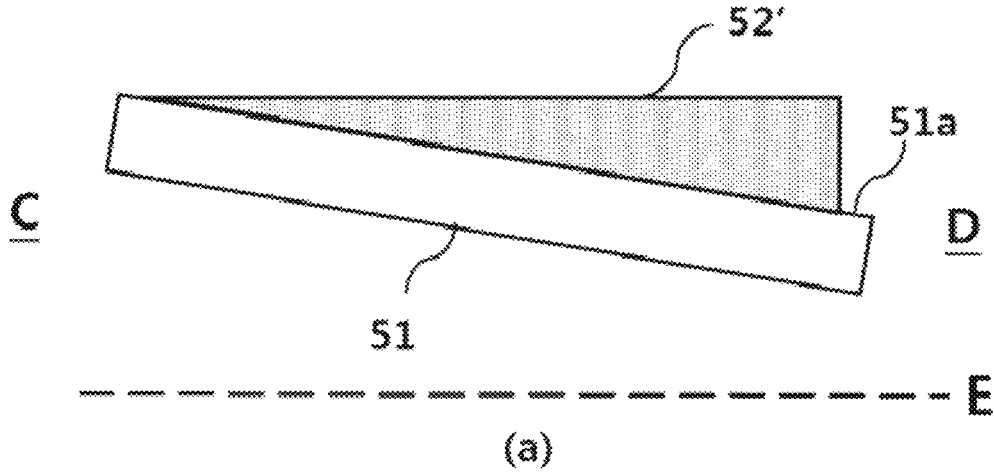
(a)
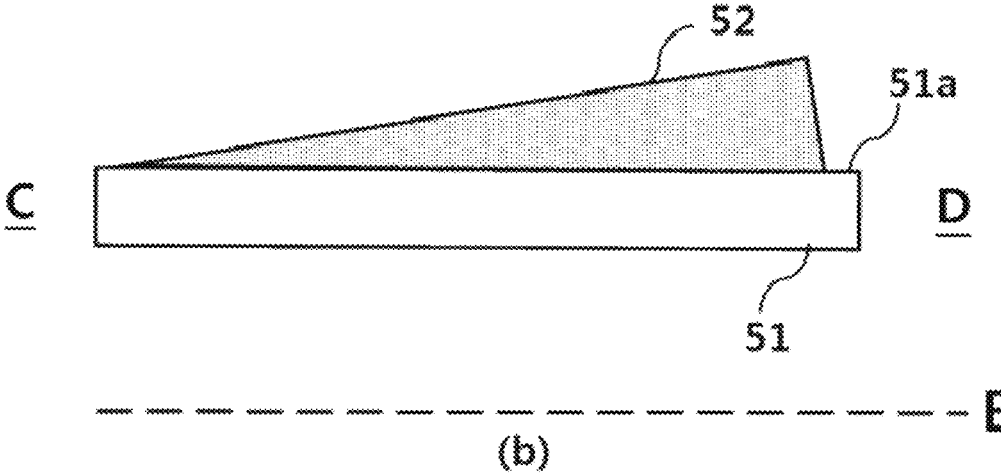
(b)

[FIG. 12]
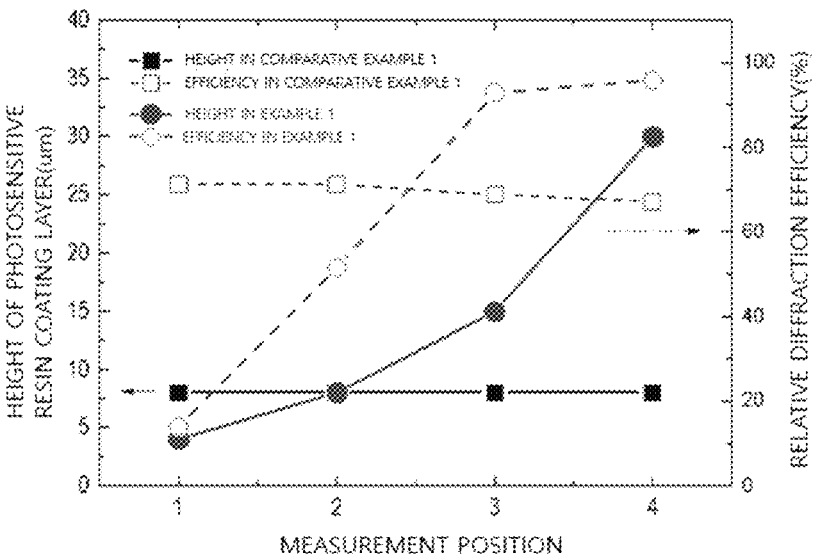
[FIG. 13]
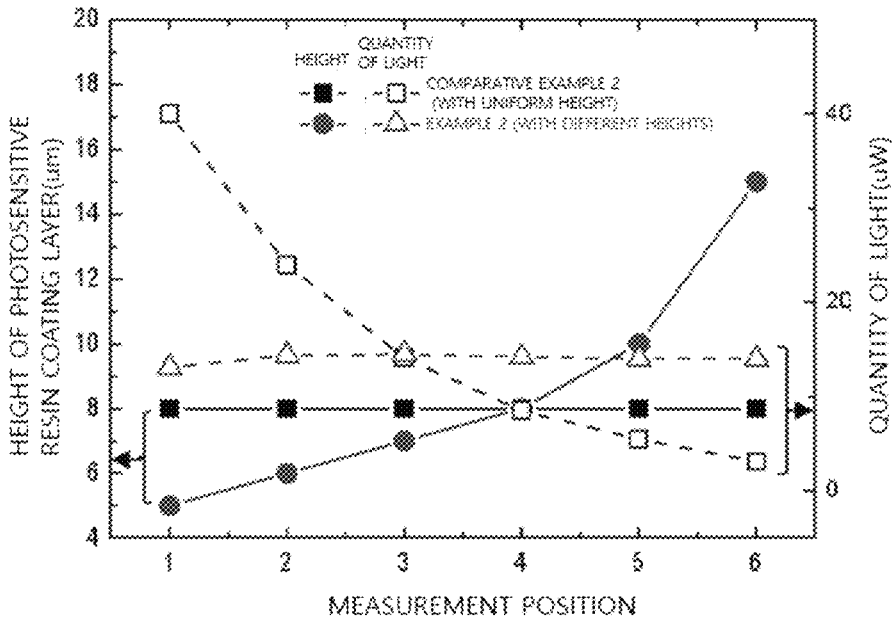

HOLOGRAPHIC OPTICAL DEVICE AND MANUFACTURING METHOD THEREFOR

CROSS-REFERENCE TO RELATED APPLICATION

This application is a national phase entry under 35 U.S.C. § 371 of International Application No. PCT/KR2020/012990, filed on Sep. 24, 2020, published in Korean, which claims priority to Korean Patent Application No. 10-2019-0121206, filed on Sep. 30, 2019, the entire contents of which are hereby incorporated herein by reference.

TECHNICAL FIELD

The present disclosure relates to a holographic optical element and a manufacturing method thereof.

BACKGROUND ART

In recent, with a growing interest in a display device that implements augmented reality (AR), mixed reality (MR), or virtual reality (VR), a study of such a display device has been actively conducted. A display unit that implements AR, MR, or VR includes a diffractive light guide plate that uses a diffraction phenomenon based on a wave-like nature of light.

As such a diffractive light guide plate, a type that includes a plurality of diffractive optical elements with a plurality of relief grating patterns and a type that includes a transmission holographic optical element in which a holographic grating pattern is recorded in a photosensitive material may be mainly used.

FIG. 1 is a view schematically illustrating an embodiment of a diffractive light guide plate including a transmission holographic optical element.

A diffractive light guide plate 1 includes a light guide plate 2 that guides light L, provided from an external light source (not illustrated) or another region of the light guide plate 2, from one side A toward the other side B through internal reflection, and a holographic optical element 3 that is provided on one surface 2*a* of the light guide plate 2 and causes a part La of the light, guided in the light guide plate 2, to be oriented toward another direction by diffraction.

The holographic optical element 3 may be provided by recording a plurality of holographic gratings 3*a* by laser light interference on opposite surfaces of a photosensitive substrate coated with a photosensitive material.

All of the plurality of holographic gratings 3*a* in the diffractive light guide plate 1 having a form illustrated in FIG. 1 are configured to have the same width. In general, efficiency in light diffraction by the holographic gratings 3*a* tends to be in proportion to the width of the grating pattern 3*a*. Here, the diffraction efficiency may be defined as a ratio of diffracted light La to light L that reaches the holographic optical element 3.

Meanwhile, the quantity of the light guided in the light guide plate 2 decreases from one side A toward the other side B due to the diffracted light La that is oriented toward another direction by diffraction through the holographic optical element 3 and lost. Here, in a case where the efficiency in light diffraction by the holographic gratings 3*a* is the same for all the respective holographic gratings 3*a*, the quantity of light reaching the holographic grating 3*a* decreases from one side A toward the other side B, but the diffraction efficiency is the same. Therefore, the quantity of diffracted light La also cannot but decrease from one side A toward the other side B. That is, uniformity of the diffracted light La that is diffracted by the holographic gratings 3*a* for display deteriorates, which is problematic.

FIG. 2 is a view schematically illustrating another embodiment of the diffractive light guide plate including a transmission holographic optical element. A diffractive light guide plate 1' includes a light guide plate 2' that guides light L', provided from an external light source (not illustrated) or another region of the light guide plate 2', from one side A toward the other side B through internal reflection.

In order to solve the problem in that the uniformity of the diffracted light La deteriorates in the diffractive light guide plate 1 in the embodiment described above, a diffractive light guide plate 1' in another embodiment may be configured so that the width of each of a plurality of holographic gratings 3*a'* increases from one side A toward the other side B. By doing so, diffraction efficiency of the holographic grating 3*a'* increases from one side A toward the other side B. In this case, since the diffraction efficiency increases even when the quantity of light reaching the holographic grating 3*a'* decreases from one side A toward the other side B, the quantity of diffracted light La' may be substantially uniform from one side A toward the other side B.

Meanwhile, the following recording process using laser light may be generally used to form a holographic optical element 3' in which the width of the grating pattern 3*a'* increases from one side A toward the other side B as illustrated in FIG. 2.

FIG. 3 is a view schematically illustrating an example of the recording process using laser light for manufacturing a transmission holographic optical element.

First, a photosensitive substrate 30 in which one surface of a substrate 31 is coated with a photosensitive resin 32 is prepared. As an example, the substrate 31 may be a film type that may be attached to a light guide plate later. As another example, the substrate 31 may also be provided as a light guide plate itself that may guide light.

Then, one surface 30*a* and the other surface 30*b* of the photosensitive substrate 30 are irradiated with rays of laser light L1 and L2, respectively, to record holographic gratings. Here, it is necessary to increase the quantity of light and/or irradiation time of the laser light L1 and L2 from one side A toward the other side B of the photosensitive substrate 30 in order to increase the width of the holographic grating from one side A toward the other side B. However, a process of increasing the quantity of light and/or irradiation time of the laser light L1 and L2 for each position is complicated, and it is difficult to continuously change the quantity of light and/or irradiation time according to positions.

Since the above-described background art is technical information possessed by the inventor for deriving embodiments of the present disclosure or acquired in the process of deriving embodiments of the present disclosure, it may not be necessarily said that the background art is a publicly known technique disclosed to the general public before filing the application for the embodiments of the present disclosure.

DISCLOSURE

Technical Problem

Embodiments of the present disclosure intend to provide a holographic optical element including holographic gratings having different heights according to positions, and a manufacturing method capable of easily forming the holographic optical element.

The technical problem of the present disclosure is not limited to the aforementioned problem, and the other unmentioned problems will be clearly understood by those skilled in the art from the following description.

Technical Solution

An embodiment of the present disclosure provides a manufacturing method of a holographic optical element including holographic gratings, the manufacturing method including: a step (a) of forming a photosensitive substrate by coating one surface of a substrate with a photosensitive resin; and a step (b) of recording the holographic gratings by irradiating each of one surface and the other surface of the photosensitive substrate with laser light, wherein in the step (a), the photosensitive resin is applied so that a height of a photosensitive resin coating layer varies along a predetermined direction.

In the present embodiment, the height of the photosensitive resin coating layer may gradually increase along the predetermined direction.

In the present embodiment, in the step (a), the photosensitive resin may be sprayed onto one surface of the substrate at a plurality of positions, and an amount of sprayed photosensitive resin may vary according to positions.

In the present embodiment, the step (a) may include: a step (a-1) of dipping the substrate in a container containing the photosensitive resin; and a step (a-2) of separating the substrate from the container by moving the substrate in one direction, and in the step (a-2), the substrate may be separated from the container while a moving speed of the substrate is changed.

In the present embodiment, the step (a) may include: a step (a-1) of providing the photosensitive resin between the substrate and an auxiliary substrate; and a step (a-2) of moving at least one of the substrate and the auxiliary substrate, and in the step (a-2), at least one of the substrate and the auxiliary substrate may be moved while a relative moving speed of one of the substrate and the auxiliary substrate is changed with respect to the other one.

In the present embodiment, in the step (a), the photosensitive resin may be provided in a state where one surface of the substrate is inclined with respect to the ground, and the photosensitive resin may be dried.

Another embodiment provides a holographic optical element including a photosensitive resin coating layer formed on one surface of a substrate, and a plurality of holographic gratings recorded in the photosensitive resin coating layer, wherein a height of the photosensitive resin coating layer varies along a predetermined direction, and heights of the holographic gratings vary along the predetermined direction.

In another embodiment, the height of the photosensitive resin coating layer may gradually increase along the predetermined direction, and the heights of the holographic gratings may gradually increase along the predetermined direction.

In another embodiment, the holographic gratings may be recorded over the entire height of the photosensitive resin coating layer, and the holographic gratings may have the same width.

Advantageous Effects

According to an embodiment of the present disclosure, it is possible to easily form holographic gratings having different heights according to positions.

According to an embodiment of the present disclosure, the height of the photosensitive resin coating layer may vary along a predetermined direction, and the holographic gratings may be recorded in the photosensitive resin coating layer, such that it is possible to adjust diffraction efficiency of the holographic optical element.

Furthermore, when applying the holographic optical element according to an embodiment of the present disclosure to a diffraction light guide plate, in a case where the diffraction efficiency of the holographic optical element increases even when the quantity of light reaching the holographic grating decreases from one side toward the other side of the diffraction light guide plate, the quantity of diffracted light at the diffraction light guide plate may be substantially uniform.

The effects of the present disclosure are not limited to those described above, and effects that are not mentioned may be clearly understood by those skilled in the art from the present specification and the accompanying drawing.

BRIEF DESCRIPTION OF DRAWINGS

FIG. 1 is a view schematically illustrating an embodiment of a diffractive light guide plate including a transmission holographic optical element.

FIG. 2 is a view schematically illustrating another embodiment of the diffractive light guide plate including a transmission holographic optical element.

FIG. 3 is a view schematically illustrating an example of a recording process using laser light for manufacturing a transmission holographic optical element.

FIG. 4 is a view schematically illustrating a diffractive light guide plate including a transmission holographic optical element according to an embodiment of the present disclosure.

FIGS. 5 to 7 are views for describing a manufacturing method of a holographic optical element according to an embodiment of the present disclosure.

FIG. 8 is a view schematically illustrating a method of forming a photosensitive resin coating layer on one surface of a substrate according to a first embodiment.

FIG. 9 is a view schematically illustrating a method of forming the photosensitive resin coating layer on one surface of the substrate according to a second embodiment.

FIG. 10 is a view schematically illustrating a method of forming the photosensitive resin coating layer on one surface of the substrate according to a third embodiment.

FIG. 11 is a view schematically illustrating a method of forming the photosensitive resin coating layer on one surface of the substrate according to a fourth embodiment.

FIG. 12 is a graph showing the comparison of diffraction efficiency between an example according to the present disclosure and a comparative example.

FIG. 13 is a graph showing the comparison of the quantity of light between an example according to the present disclosure and a comparative example.

MODE FOR INVENTION

The present disclosure will become apparent from embodiments to be described below in detail together with the accompanying drawings. However, the present disclosure is not limited to embodiments to be described below, but may be implemented in various different forms, these embodiments will be provided only in order to make the present disclosure complete and allow those skilled in the art to completely recognize the scope of the present disclosure, and the present disclosure will be defined by the scope of the claims.

Meanwhile, terms used in the present specification are for explaining embodiments rather than limiting the present disclosure. In the present specification, a singular form includes a plural form, unless the context clearly indicates otherwise. Components, steps, operations, and/or elements mentioned by terms "comprise" and/or "comprising" used in the present specification do not exclude the existence or addition of one or more other components, steps, operations, and/or elements. Terms "first", "second", and the like, may be used to describe various components, but the components should not be construed as being limited by these terms. The terms are used only to distinguish one component from another component.

FIG. 4 is a view schematically illustrating a diffractive light guide plate including a transmission holographic optical element according to an embodiment of the present disclosure.

A diffractive light guide plate 10 according to an embodiment of the present disclosure may include a light guide plate 11, and a holographic optical element 12 provided on one surface 11a of the light guide plate 11.

The holographic optical element 12 may be provided by recording a plurality of holographic gratings 12a by laser light interference on opposite surfaces of a photosensitive resin coating layer 12b.

The height of the photosensitive resin coating layer 12b of the holographic optical element 12 increases from one side A toward the other side B, and the holographic gratings 12a are recorded over the entire height of the photosensitive resin coating layer 12b as illustrated in FIG. 4. Therefore, the heights of the holographic gratings 12a may also increase from one side A toward the other side B, similarly to the photosensitive resin coating layer 12b.

The heights of the plurality of holographic gratings 12a in the diffractive light guide plate 10 illustrated in FIG. 4 increase from one side A toward the other side B, and efficiency in light diffraction by the holographic grating 12a may increase as the heights of the holographic gratings 12a increase. Therefore, since the diffraction efficiency gradually increases even when the quantity of light reaching the holographic grating 12a decreases from one side A toward the other side B, the quantity of diffracted light La" may be substantially uniform from one side A toward the other side B.

A manufacturing method of a holographic optical element according to an embodiment of the present disclosure is a method for manufacturing a holographic optical element in which a plurality of holographic gratings having different heights according to positions are formed. For example, in the holographic optical element manufactured in the present embodiment, the heights of the plurality of holographic gratings 12a may increase from one side A toward the other side B as illustrated in FIG. 4.

FIGS. 5 to 7 are views for describing a manufacturing method of a holographic optical element according to an embodiment of the present disclosure.

The manufacturing method of a holographic optical element according to an embodiment of the present disclosure may include: a step (a) of forming a photosensitive substrate by coating one surface of a substrate with a photosensitive resin; and a step (b) of recording holographic gratings by irradiating each of one surface and the other surface of the photosensitive substrate with laser light.

The step (a) may be a step of forming a photosensitive resin coating layer 52 by coating one surface of a substrate 51 with the photosensitive resin to form a photosensitive substrate 50 including the photosensitive resin coating layer 52. As an example, the substrate 51 may be a film type that may be attached to a light guide plate later. As another example, the substrate 51 may also be provided as a light guide plate itself that may guide light. In a case where the substrate 51 is a light guide plate, a glass substrate or plastic substrate with a high refractive characteristic may be used. Examples of the photosensitive resin may include a photopolymer, a photoresist, a silver halide emulsion, dichromated gelatin, a photographic emulsion, a photothermoplastic material, and a photorefractive material.

Here, in the step (a), a photosensitive resin 52' may be applied so that the height of the photosensitive resin coating layer 52 varies along a predetermined direction. The photosensitive resin coating layer 52 may be formed so that a height h' of the photosensitive resin coating layer 52 continuously formed increases from one side C toward the other side D as illustrated in FIG. 5.

Referring to FIGS. 6 and 7, the step (b) may be a step of irradiating one surface 50a and the other surface 50b of the photosensitive substrate 50 with rays of laser light L1 and L2, respectively, to record holographic gratings 61a. Referring to FIG. 6, one surface 50a and the other surface 50b of the photosensitive substrate 50 in which the height h' of the resin coating layer 52 increases from one side C toward the other side D as illustrated in FIG. 5 are irradiated with the rays of the laser light L1 and L2, respectively. Here, the quantity of light and/or irradiation time according positions for each type of laser light may be the same for first laser light L1 and second laser light L2 with which one surface 50a and the other surface 50b of the photosensitive substrate 50 are irradiated, to thereby make the holographic gratings 61a have substantially the same width as illustrated in FIG. 7. Meanwhile, since the height of the photosensitive resin coating layer 52 increases from one side C toward the other side D, it is possible to manufacture a holographic optical element 61 in which the heights of the holographic gratings 61a recorded in the photosensitive resin coating layer 52 increase from one side C toward the other side D. Here, the height of the holographic grating 61a may mean the height from a bottom surface between the holographic gratings 61a to an upper surface of each of the holographic gratings 61a. Further, the bottom surfaces between the holographic gratings 61a may be flush with one surface of the substrate 51. Therefore, the holographic gratings 61a may be formed to have different heights from one surface of the substrate 51.

FIG. 8 is a view schematically illustrating a method of forming the photosensitive resin coating layer on one surface of the substrate according to a first embodiment.

Referring to FIG. 8, in the step (a), the photosensitive resin 52' may be sprayed onto one surface of the substrate 51 at a plurality of positions, and the amount of sprayed photosensitive resin 52' may vary according to positions. In this case, a plurality of spraying devices 80 may be arranged and the amount of photosensitive resin sprayed through each spraying device 80 may be controlled to be different. Alternatively, when only one spraying device 80 is used, the amount of photosensitive resin sprayed through the spraying device 80 may be controlled to be different according to positions by moving the spraying device 80 or substrate 51.

FIG. 9 is a view schematically illustrating a method of forming the photosensitive resin coating layer on one surface of the substrate according to a second embodiment.

Referring to FIG. 9, the step (a) may include: a step (a-1) of dipping the substrate 51 in a container 90 containing the photosensitive resin 52' (see (a) and (b) of FIG. 9); and a step (a-2) of separating the substrate 51 from the container 90 by moving the substrate 51 in one direction (see (c) of FIG. 9). Here, the photosensitive resin 52' in the container 90 may be in a liquid state. Here, in the step (a-2), the substrate 51 may be separated from the container 90 while a moving speed of the substrate is changed. For example, in a case of gradually increasing the moving speed of the substrate 51 when separating the substrate 51 from the container 90, the height of the photosensitive resin coating layer 52 may decrease from an upper portion 51$u$ to a lower portion 51$d$ of the substrate 51. As another example, in a case of gradually decreasing the moving speed of the substrate 51 when separating the substrate 51 from the container 90, the height of the photosensitive resin coating layer 52 may increase from the upper portion 51$u$ to the lower portion 51$d$ of the substrate 51.

FIG. 10 is a view schematically illustrating a method of forming the photosensitive resin coating layer on one surface of the substrate according to a third embodiment.

Referring to FIG. 10, the step (a) may include: a step (a-1) of providing the photosensitive resin between the substrate 51 and an auxiliary substrate 100; and a step (a-2) of moving at least one of the substrate 51 or the auxiliary substrate 100. Here, the photosensitive resin 52' may be in a liquid state between the substrate 51 and the auxiliary substrate 100. Here, in the step (a-2), at least one of the substrate 51 and the auxiliary substrate 100 may be moved while a relative moving speed of one of the substrate 51 and the auxiliary substrate 100 is changed with respect to the other one. For example, in a case of increasing a relative moving speed between the substrate 51 and the auxiliary substrate 100, the height of the photosensitive resin coating layer 52 on the substrate 51 may gradually decrease along a moving direction of the auxiliary substrate 100. As another example, in a case of decreasing the relative moving speed between the substrate and the auxiliary substrate 100, the height of the photosensitive resin coating layer 52 on the substrate 51 may gradually increase along the moving direction of the auxiliary substrate 100.

The method of forming the photosensitive resin coating layer 52 on one surface of the substrate 51 according to the third embodiment as described above may be appropriate for a process for mass production, because it is easy to organize and control a mechanism for relative movement of the auxiliary substrate 100 with respect to the substrate 51.

FIG. 11 is a view schematically illustrating a method of forming the photosensitive resin coating layer on one surface of the substrate according to a fourth embodiment.

Referring to FIG. 11, in the step (a), the photosensitive resin 52' may be provided in a state where one surface 51$a$ of the substrate 51 is inclined with respect to the ground E, and the photosensitive resin may be dried while a slope of one surface of the substrate 51 is changed with respect to the ground E. First, when the liquid photosensitive resin 52' is cast in a state where one surface 51$a$ of the substrate 51 is inclined with respect to the ground E, and an upper surface of the photosensitive resin 52' may maintain a state of being parallel to the ground E as illustrated in (a) of FIG. 11. Here, since one surface 51$a$ of the substrate 51 is inclined with respect to the ground E, a distance between one surface 51$a$ of the substrate 51 and the upper surface of the photosensitive resin 52' may gradually increase from one side C toward the other side D. In this state, when the photosensitive resin 52' is dried, the photosensitive resin coating layer 52 may be formed so that the distance between one surface 51$a$ of the substrate 51 and the upper surface of the photosensitive resin 52' gradually increases from one side C toward the other side D. As illustrated in (b) of FIG. 11, when one surface 51$a$ of the substrate 51 is arranged to be parallel to the ground E, the height of the photosensitive resin coating layer 52 increases from one side C toward the other side D of the substrate 51.

According to an embodiment of the present disclosure, it is possible to easily form holographic gratings having different heights according to positions.

FIG. 12 is a graph showing the comparison of diffraction efficiency between an example according to the present disclosure and a comparative example.

For the comparison, holographic gratings were recorded by irradiating opposite surfaces of the photosensitive resin coating layer with laser light. Laser light with a wavelength of 532 nm and an output power of 250 mW was used, and a reference beam and an object beam with which the photosensitive resin coating layer is irradiated had the same power of 2 mW so that a beam ratio (BR) becomes 1. The holographic gratings were recorded by irradiating the photosensitive resin coating layer with the laser light at each of angles of 0 degrees and 60 degrees, and recording times thereof were the same, 10 seconds.

Here, in Example 1, a photosensitive substrate in which the height of the photosensitive resin coating layer increases according to the embodiments of the present disclosure was used, and in Comparative Example 1, a photosensitive substrate in which the height of the photosensitive resin coating layer is uniform was used.

For the holographic optical elements of Example 1 and Comparative Example 1, four measurement positions (#1 to #4) were set at predetermined intervals from one side toward the other side in order to measure intensities of diffracted light and transmitted light at each point. The intensities of the diffracted light and transmitted light were obtained by measuring the quantities of light corresponding to 532 nm by using a power meter.

Relative diffraction efficiency according to the height of the photosensitive resin coating layer, that is, the height of the holographic grating, was obtained using the intensities of the diffracted light and transmitted light as in the following Equation.

$$\text{relative diffraction efficiency} = \frac{\text{diffracted light intensity}}{\left(\begin{array}{c}\text{diffracted light intensity}+\\ \text{transmitted light intensity}\end{array}\right)} \times 100 \qquad <\text{Equation}>$$

In the following Table 1 for comparing values of the comparative example and the example, it may be appreciated that the diffraction efficiency varies according to the height in Example 1 in which the height of the photosensitive resin coating layer varies according to the measurement positions. More specifically, it may be appreciated that the diffraction efficiency increases in proportion to the height. On the contrary, in Comparative Example 1 in which the height of the photosensitive resin coating layer is uniform, the value of the diffraction efficiency is maintained at the same level without a substantial change according to the height.

TABLE 1

| Classifi-cation | Measurement Position | Height (um) | Transmitted Light (uW) | Dif-fracted Light (uW) | (Relative) Diffracted Efficiency (%) |
|---|---|---|---|---|---|
| Example 1 | #1 | 4 | 670 | 110 | 14.1 |
| | #2 | 5 | 350 | 373 | 51.6 |
| | #3 | 15 | 50 | 650 | 92.9 |
| | #4 | 30 | 30 | 680 | 95.8 |
| Compara-tive Example 1 | #1 | 8 | 210 | 520 | 71.2 |
| | #2 | | 210 | 518 | 71.2 |
| | #3 | | 230 | 510 | 68.9 |
| | #4 | | 240 | 490 | 67.1 |

The diffraction efficiency of the optical element may be adjusted according to the height of the photosensitive resin coating layer, that is, the height of the recorded holographic grating, which enables adjustment of the diffraction efficiency according to regions of the holographic optical element.

Therefore, in a case where the diffraction efficiency of the holographic optical element 12 gradually increases as the heights of the plurality of holographic gratings 12a increase from one side A toward the other side B as in the diffractive light guide plate 10 illustrated in FIG. 4, the quantity of diffracted light at the diffraction light guide plate 10 may be substantially the same even when the quantity of light reaching the holographic optical element 12 decreases.

FIG. 13 is a graph showing a difference in quantity of emitted light in the above-described diffraction light guide plate between an example according to the present disclosure and a comparative example.

In Example 2, a diffraction light guide plate was formed by recording the holographic gratings in the photosensitive substrate in which the height of the photosensitive resin coating layer increases according to the embodiments of the present disclosure, and the plurality of holographic gratings having heights increasing from one side toward the other side are recorded in the light guide plate as illustrated in FIG. 4. In Comparative Example 2, a diffraction light guide plate was formed by recording the plurality of holographic gratings in the photosensitive resin coating layer having a uniform height on the light guide plate as illustrated in FIG. 1. In Example 2 and Comparative Example 2, the holographic gratings were recorded by the same method as in Example 1 and Comparative Example 1, and the height of the photosensitive resin coating layer varied according to measurement positions as shown in the following Table.

For the diffraction light guide plates of Example 2 and Comparative Example 2, six measurement positions (#1 to #6) were set at predetermined intervals from one side toward the other side in order to measure the height of the photosensitive resin coating layer and the quantity of emitted light at each point. The quantity of emitted light was obtained by measuring the quantity of light emitted through the holographic optical element at each measurement position while 532 nm light of 100 uW is incident onto the light guide plate and propagates from one side toward the other side of the light guide plate. The height of the photosensitive resin coating layer and the quantity of emitted light at each measurement position in Example 2 and Comparative Example 2 are as shown in the following Table 2.

TABLE 2

| Classification | Measurement Position | Height (um) | Quantity of Light (uW) |
|---|---|---|---|
| Example 2 | #1 | 5 | 13.12 |
| | #2 | 6 | 14.39 |
| | #3 | 7 | 14.51 |
| | #4 | 8 | 14.19 |
| | #5 | 10 | 13.99 |
| | #6 | 15 | 14 |
| Comparative Example 2 | #1 | 8 | 40 |
| | #2 | | 23.99 |
| | #3 | | 14.12 |
| | #4 | | 8.51 |
| | #5 | | 5.49 |
| | #6 | | 3.14 |

Comparing Example 2 and Comparative Example 2 as in FIG. 13, it may be appreciated that the quantity of emitted light is substantially uniform, regardless of the measurement positions, in Example 2 in which the height of the photosensitive resin coating layer gradually increases. On the contrary, it may be appreciated that the quantity of emitted light drastically decreases from one side toward the other side in a case where the height of the photosensitive resin coating layer is uniform.

Although the present disclosure has been described in relation to the preferred embodiments described above, various corrections or modifications can be made without departing from the subject matter and scope of the present disclosure. Therefore, the appended claims will include such corrections or modifications as long as the corrections or modifications belong to the subject matter of the present disclosure.

The invention claimed is:

1. A method of manufacturing a holographic optical element including holographic gratings, the method comprising:

forming a photosensitive substrate by coating an exposed surface of an initial single substrate with a photosensitive resin to form a photosensitive resin coating layer; and recording the holographic gratings by irradiating each of a first surface and a second surface of the photosensitive substrate with laser light, wherein during the forming, the photosensitive resin coating layer is continuously formed, and the photosensitive resin is applied so that a height of the photosensitive resin coating layer varies along a predetermined direction, the height being defined in a height direction transverse to the exposed surface of the initial single substrate, the predetermined direction being parallel to the exposed surface, wherein the holographic gratings are recorded over an entirety of the height of the photosensitive resin coating layer, and the holographic gratings each have a same width along the predetermined direction, and wherein during the forming, the photosensitive resin is directly provided on the exposed surface of the initial single substrate without interposing any auxiliary substrate, with the exposed surface of the initial single substrate being inclined with respect to the ground, and an upper surface of the photosensitive resin being maintained parallel to the ground due to gravity, and the photosensitive resin is dried to form the photosensitive resin coating layer, and wherein the height of the photosensitive resin coating layer linearly increases along the predetermined direction due to gravity forming the upper surface of the photosensitive resin parallel to the ground while the initial single substrate is inclined with respect to the ground.

2. A holographic optical element including a photosensitive resin coating layer formed on an exposed surface of an initial single substrate, and a plurality of holographic gratings recorded in the photosensitive resin coating layer, wherein the photosensitive resin coating layer is continuously formed, and a height of the photosensitive resin coating layer varies along a predetermined direction, the height being defined in a height direction transverse to the exposed surface of the initial single substrate, the predetermined direction being parallel to the exposed surface, and heights of the holographic gratings in the height direction vary along the predetermined direction, wherein the holographic gratings are recorded over an entirety of the height of the photosensitive resin coating layer, and the holographic gratings each have a same width along the predetermined direction, wherein the photosensitive resin coating layer shows structural evidence of being directly formed and dried on the exposed surface of the initial single substrate without interposing any auxiliary substrate, with the exposed surface of the initial single substrate being inclined with respect to the ground, and an upper surface of the photosensitive resin being maintained parallel to the ground due to gravity, and wherein the height of the photosensitive resin coating layer linearly increases along the predetermined direction due to gravity forming the upper surface of the photosensitive resin parallel to the ground while the initial single substrate is inclined with respect to the ground, and the heights of the holographic gratings linearly increase along the predetermined direction.

\* \* \* \* \*